United States Patent
Johnson et al.

(10) Patent No.: US 9,758,859 B2
(45) Date of Patent: Sep. 12, 2017

(54) COATED CUTTING TOOL AND A METHOD OF PRODUCING A COATED CUTTING TOOL

(71) Applicant: SANDVIK INTELLECTUAL PROPERTY AB, Sandviken (SE)

(72) Inventors: Lars Johnson, Stockholm (SE); Robert Pilemalm, Linkoping (SE); Lina Rogstrom, Klockrike (SE)

(73) Assignee: SANDVIK INTELLECTUAL PROPERTY, Sandviken (SE)

( * ) Notice: Subject to any disclaimer, the term of this patent is extended or adjusted under 35 U.S.C. 154(b) by 92 days.

(21) Appl. No.: 14/810,113

(22) Filed: Jul. 27, 2015

(65) Prior Publication Data

US 2016/0032444 A1     Feb. 4, 2016

(30) Foreign Application Priority Data

Jul. 29, 2014 (EP) .................................... 14178913

(51) Int. Cl.

| | |
|---|---|
| *C23C 14/32* | (2006.01) |
| *B23B 27/14* | (2006.01) |
| *C23C 14/06* | (2006.01) |
| *C23C 28/04* | (2006.01) |
| *C23C 28/00* | (2006.01) |

(52) U.S. Cl.
CPC .......... *C23C 14/325* (2013.01); *B23B 27/148* (2013.01); *C23C 14/0641* (2013.01); *C23C 28/042* (2013.01); *C23C 28/044* (2013.01); *C23C 28/322* (2013.01); *C23C 28/347* (2013.01); *B23B 2222/28* (2013.01); *B23B 2226/125* (2013.01); *B23B 2228/08* (2013.01); *B23B 2228/105* (2013.01)

(58) Field of Classification Search
USPC .......... 51/307, 309; 428/336, 697, 698, 699; 204/192, 192.16
See application file for complete search history.

(56) References Cited

U.S. PATENT DOCUMENTS

| | | | |
|---|---|---|---|
| 2005/0170162 A1* | 8/2005 | Yamamoto .......... | C23C 14/0036 428/698 |
| 2012/0114436 A1* | 5/2012 | Andersson ............ | C04B 41/009 204/192.38 |
| 2013/0126347 A1 | 5/2013 | Krassnitzer | |

FOREIGN PATENT DOCUMENTS

| | | | |
|---|---|---|---|
| EP | 2628826 A1 | | 8/2013 |
| JP | 07-108404 | * | 4/1995 |
| JP | 2004025335 A | | 1/2004 |

OTHER PUBLICATIONS

Chen et al "Influence of ZR on structure, mechanical and thermal properrties of Ti-Al-N" Thin Solid Films (2011) 519 p. 5503-5510.*

(Continued)

*Primary Examiner* — Archene Turner
(74) *Attorney, Agent, or Firm* — Corinne R. Gorski

(57) ABSTRACT

The present disclosure relates to a coated cutting tool including a substrate and a coating disposed on the substrate, wherein the coating includes a layer of $Ti_xZr_yAl_{(1-x-y)}N$, where $0<x\leq0.3$, $0.2\leq y\leq0.8$ and $0.1\leq(1-x-y)\leq0.7$. The disclosure further relates to a method of producing such a coated cutting tool, and to a cutting insert forming a coated cutting tool.

22 Claims, 2 Drawing Sheets

(56) References Cited

OTHER PUBLICATIONS

Abadias et al "Thermal stability and pxidation behavior of quternary TiZrAlN magnetron sputtered thin films:Influence of the pristine microstructure" Surf & Coat Techn (2013) 237 p. 187-195.*

Saladukhin et al "Influence of Al content on the phas formation, growth stress and mchanical properties of TiZrAlN coatings" Thin Solid Films (2013) 538 p. 32-41.*

* cited by examiner

COATED CUTTING TOOL AND A METHOD OF PRODUCING A COATED CUTTING TOOL

RELATED APPLICATION DATA

This application claims priority under 35 U.S.C. §119 to EP Patent Application No. 14178913.1, filed on Jul. 29, 2014, which the entirety thereof is incorporated herein by reference.

TECHNICAL FIELD

The disclosure relates to a coated cutting tool for metal machining, such as chip forming machining, including a substrate and a coating on the substrate, and to a method of producing such a coated cutting tool.

BACKGROUND

Cutting tools such as cutting inserts, milling tools, drilling tools etc. may be used for chip forming machining of material, such as metals. Such tools are most often made of a durable material such as cemented carbide, cubic boron nitride or high speed steel. To improve the properties of the tool, e.g. wear properties, such tools are commonly provided with a surface coating. Such coatings may be deposited on the tool by means of chemical (CVD) or physical (PVD) vapour deposition.

Different types of surface coatings have been used until now, e.g. TiN, TiAlN. During metal machining with a coated cutting tool, the temperature in the vicinity of the cutting edge of the tool will increase due to shearing of the machined material, and friction. The temperature may thus become very high at the coating, i.e. 1100° C. or more. Cubic TiAlN normally decomposes into cubic TiN and cubic AlN at 800-900° C., and thereafter the cubic AlN transforms into hexagonal wurtzite AlN at about 1000° C., which is a less desirable phase. In EP 2628826 A1 a multilayer coating of alternating layers of ZrAlN and TiN is disclosed. This type of coating was developed to provide a high thermal stability of the coating in order to provide a high hardness even if subjected to such high temperatures.

It is sought to further develop surface coatings with improved properties when subjected to high temperatures. In particular, it is desirable to provide coatings having a low likelihood of decomposing into less desirable phases at elevated temperatures, e.g. hexagonal AlN phases. Therefore, it is sought to provide a coated cutting tool with a coating having a composition which is relatively stable at elevated temperatures.

SUMMARY

The present disclosure provides a coated cutting tool with improved properties during machining operations. In particular, there is disclosed a cutting tool with a coating having a composition that is more stable at elevated temperatures.

Thus, the disclosure relates to a coated cutting tool comprising a substrate and a coating on the substrate, wherein the coating includes a layer consisting of $Ti_xZr_yAl_{(1-x-y)}N$ wherein $0 < x \leq 0.3$, $0.2 \leq y \leq 0.8$ and $0.1 \leq (1-x-y) \leq 0.7$.

The composition of the coating will reduce the likelihood of AlN decomposing into less desirable phases at elevated temperatures, e.g. hexagonal AlN phases. Thus, a coating composition is obtained, which is more stable at elevated temperatures, in particular at a temperature about 1100° C.

The coating may have a layer consisting of $Ti_xZr_yAl_{(1-x-y)}N$, wherein $x \geq 0.05$, for example, $x \geq 0.1$. The coating may have a layer consisting of $Ti_xZr_yAl_{(1-x-y)}N$, wherein $x \leq 0.25$, for example, $x \leq 0.2$. Thereby, the stability of the composition is further increased.

The coating may have a layer consisting of $Ti_xZr_yAl_{(1-x-y)}N$, wherein $y \leq 0.6$, for example, $y \leq 0.4$. Thereby, compositions having the advantages as disclosed herein may be obtained with lower amounts of Zr.

The coating may have a layer consisting of $Ti_xZr_yAl_{(1-x-y)}N$ wherein $y \geq 0.3$ or $y \geq 0.4$. Thereby, the stability of the composition is further increased. Compositions high in Zr may provide better resistance to a spinodal decomposition process, wherein TiN, AlN and ZrN may become separated.

The layer of $Ti_xZr_yAl_{(1-x-y)}N$ may have a cubic crystal structure. Thereby, the cutting properties of the cutting tool may be improved, such as lifetime and wear properties.

The layer of $Ti_xZr_yAl_{(1-x-y)}N$ may have a columnar microstructure. Thereby, the resistance to crater wear of the coating may be improved, and also the hardness of the coating. Alternatively the layer of $Ti_xZr_yAl_{(1-x-y)}N$ may have a nano-crystalline or amorphous structure.

An X-ray diffractogram of the layer of $Ti_xZr_yAl_{(1-x-y)}N$ may have a dominant peak of a (200) plane, i.e. the (200) peak may be the highest peak in the XRD diffractogram. Thereby, crystal grains are predominantly oriented in a (200) direction in the direction of growth of the coating layer.

The layer of $Ti_xZr_yAl_{(1-x-y)}N$ may be deposited by PVD, e.g. arc evaporation or sputtering. Thereby, the layer may be provided with compressive stresses, improving the toughness of the coating layer. By means of arc evaporation the deposition speed may be improved and the degree of ionisation may be improved, yielding denser layers, improved adhesion and improved geometrical coverage of the coating layer on the substrate.

The layer of $Ti_xZr_yAl_{(1-x-y)}N$ may be deposited using an arc deposition source, which includes a cathode, an anode and magnetic means that enable magnetic field lines to lead from the target surface to the anode in short connection. Such an arc deposition source is further described in US 2013/0126347 A1. Thereby, the layer may be provided with a cubic crystal structure and a columnar microstructure over the claimed composition range. US 2013/0126347 A1 teaches that the state of ionisation in the chamber may improve coating parameters, e.g. deposition rate and coating quality.

The coating may have an adhesion layer with the layer of $Ti_xZr_yAl_{(1-x-y)}N$ disposed on top of the adhesion layer. In one embodiment, the coating may consist only of an adhesion layer and the layer of $Ti_xZr_yAl_{(1-x-y)}N$ on top of the adhesion layer. The adhesion layer may be a layer of Ti, TiN, Cr, CrN or any other transition metal or transition metal nitride, for example, having a thickness in the range of 1-200 nm, such as 5-10 nm.

The coating may have an adhesive strength of at least 50 kg, for example, at least 100 kg, or at least 150 kg, as evaluated from a Rockwell indentation test. The adhesion may be evaluated from a Rockwell C indentation test procedure as described in VDI 3198, but wherein the indentation load may be varied within the range 50-150 kg. The indentation load where the coating passes the indentation test in accordance with the criteria as described in VDI 3198 may then be taken as the adhesive strength of the coating.

The coating may be a multilayer coating further having one or more layers selected from the group of TiN, TiAlN, TiSiN, TiSiCN, TiCrAlN, and CrAlN, or combinations thereof. The coating may have one or more layers having a composition including at least a first element selected from the group of Ti, Al, Cr, Si, V, Nb, Ta, Mo and W, and a second element selected from the group of B, C, N and O. The coating may have a thickness of more than 0.5 μm, and/or less than 20 μm, for example, less than 10 μm. Thereby, the properties of the coating may be optimised to specific application needs.

The layer of $Ti_xZr_yAl_{(1-x-y)}N$ may have a thickness of more than 5 nm, and/or less than 20 μm, for example, less than 10 μm. Thereby, the coating may be formed substantially by one layer of TiZrAlN, or by the combination of one or more layers of TiZrAlN with other coating layers.

The substrate may have cemented carbide or polycrystalline cubic boron nitride. These are hard materials with good cutting properties, suitable for cutting tools. The cutting tool may be in the form of a cutting insert, a milling tool or a drilling tool, preferably to be used for chip forming machining of material, such as metals.

Another aspect is to provide a method of producing a cutting tool with a coating having a composition which is more stable at elevated temperatures.

Thus, the disclosure further relates to a method of producing a coated cutting tool including providing a substrate, and depositing a coating having a layer of $Ti_xZr_yAl_{(1-x-y)}N$, where $0<x\leq0.3$, $0.2\leq y\leq0.8$ and $0.1\leq(1-x-y)\leq0.7$.

The layer may be deposited by PVD, preferably arc evaporation.

The layer may be deposited using an arc deposition source which includes a cathode, an anode and magnetic means that enable magnetic field lines to lead from the target surface to the anode in short connection. Such an arc deposition source is further described in the document US 2013/0126347 A1.

The foregoing summary, as well as the following detailed description of the embodiments, will be better understood when read in conjunction with the appended drawings. It should be understood that the embodiments depicted are not limited to the precise arrangements and instrumentalities shown.

DEFINITIONS

The compositions as defined in the claims may comprise unavoidable impurities (e.g. less than 1-3 at. %) substituting any of the metal elements Ti, Zr and Al, and/or N, while maintaining the advantageous effects of the disclosure and without departing from the claimed interval. For instance, N may be substituted by elements O, C or B at levels less than 1-3 at. %.

DETAILED DESCRIPTION OF EMBODIMENTS

An embodiment of a coated cutting tool is disclosed having a cemented carbide substrate and a coating on the substrate including a layer of $Ti_xZr_yAl_{(1-x-y)}N$. This layer is referred to as the TiZrAlN layer herein. The amount of Ti in the composition (i.e., x) is within the range $0<x\leq0.3$, for example, wherein $x\geq0.05$, or wherein $x\geq0.1$. The amount of Zr in the composition (i.e. y) is within the range $0.2\leq y\leq0.8$. The amount of Al in the composition (i.e. 1-x-y) is within the range $0.1\leq(1-x-y)\leq0.7$. The layer of TiZrAlN has a cubic crystal structure and a columnar microstructure.

The layer of TiZrAlN is deposited by arc evaporation on a substrate having cemented carbide or polycrystalline cubic boron nitride. Optionally, the coating includes a 5-10 nm thick adhesion layer of Ti, TiN, Cr or CrN and the layer of TiZrAlN on top of the adhesion layer. The thickness of the coating is between 0.5-20 μm, typically below 10 μm. The layer of TiZrAlN may be one layer in a multilayer coating having a composition variation between different layers in the multilayer. Alternatively, the coating may be the TiZrAlN layer, possibly in combination with an adhesion layer.

The adhesion of the coating may be determined by a Rockwell C indentation test procedure as described in VDI 3198, but wherein the indentation load may be varied between 50-150 kg. The indentation load where the coating passes the indentation test in accordance with the criteria as described in VDI 3198, is taken as the adhesive strength of the coating. Using this method, the coating may have an adhesion of at least 50 kg, or at least 100 kg, for example, at least 150 kg.

Figure 1:
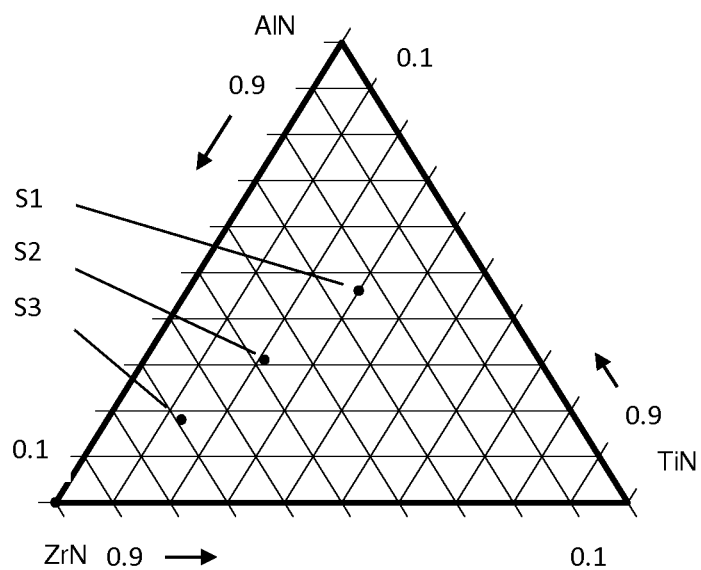
FIG. 1 is a pseudo-ternary phase diagram of TiN—ZrN—AlN indicating examples of claimed compositions.

In FIG. 1, a pseudo-ternary phase diagram of the TiN—ZrN—AlN system is shown. Each corner of the graph corresponds to the pure component TiN, ZrN and AlN, as indicated in the graph. Each line parallel to the respective opposite side in the graph indicates 10% intervals of the respective component.

EXAMPLES

In FIG. 1, three examples of compositions within the disclosed range are disclosed. The composition and thickness of the TiZrAlN layer in each example is shown in Table 1.

TABLE 1

Sample coatings S1, S2 and S3.

| | TiN (%) | ZrN (%) | AlN (%) | Thickness/μm |
|---|---|---|---|---|
| S1/Sample 1 | 30 | 24 | 46 | 9.5 |
| S2/Sample 2 | 21 | 48 | 31 | 13 |
| S3/Sample 3 | 13 | 69 | 18 | 8 |

The sample coatings were all deposited by two cathode assemblies, one with a $Ti_{0.33}Al_{0.67}$-target and one with a Zr-target. Substrates of cemented carbide were placed at different positions in the deposition chamber to obtain a variation of the composition of the deposited TiZrAlN layers.

The substrates were coated in an Oerlikon Balzer INNOVA System with the Advanced Plasma Optimizer upgrade. The substrates were put inside the vacuum chamber, which was equipped with two cathode assemblies. The chamber was pumped down to high vacuum (less than $10^{-2}$ Pa). The chamber was heated to 350-500° C. by heaters located inside the chamber, in this specific case 400° C. The substrates were then etched for 25 minutes in an Ar glow discharge. The cathodes were placed beside each other in the chambers. The cathodes were both provided with a ring-shaped anode placed around them (as disclosed in US 2013/0126347 A1), with a system providing a magnetic field with field lines going out from the target surface and entering the anode (see US 2013/0126347 A1). The chamber pressure (reaction pressure) was set to 3.5 Pa of $N_2$ gas, and a negative voltage of −30 V (relative to the chamber walls)

was applied to the substrate assembly. The cathodes were run in an arc discharge mode at 160 A each for 60 minutes. As the two cathodes evaporate from different target materials, a compositional gradient was formed at the sample assembly, such that substrate samples placed near the Zr target were rich in Zr, and samples placed near the Ti—Al target were richer in Ti and Al.

The compositions of the samples were determined by energy dispersive X-ray spectroscopy (EDX). The composition of S1 was $Ti_{0.30}Zr_{0.24}Al_{0.46}N$, the composition of S2 was $Ti_{0.21}Zr_{0.48}Al_{0.31}N$ and the composition of S3 was $Ti_{0.13}Zr_{0.69}Al_{0.18}N$.

Figure 2:
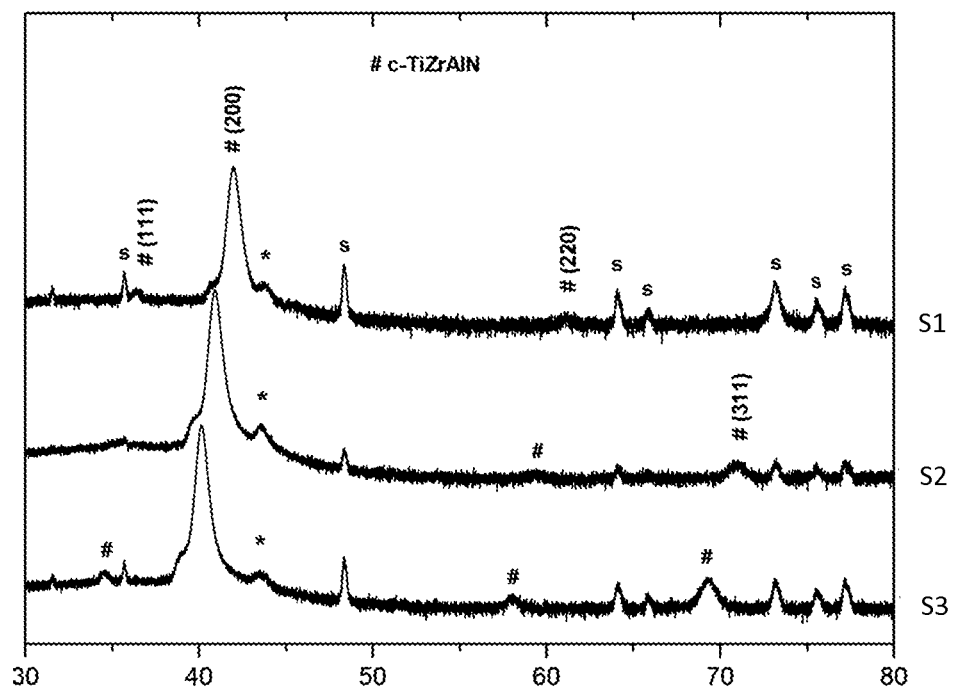
FIG. 2 is an X-ray diffractogram of three compositions of coatings as disclosed herein.

FIG. 2 shows X-ray diffractograms for the three coatings disclosed in Table 1. The samples all show a TiZrAlN of cubic structure. All have a dominant peak from a (200) plane. Further to this, peaks from (111), (220) and (311) planes are visible. There is a shift in the position of the (200) peak due to changes in lattice parameters between the coatings.

The samples were heat treated in order to evaluate the behaviour at elevated temperatures. This was done by annealing at 1100° C. for 2 h. The structure of as-deposited coatings and annealed coatings were characterized by X-ray diffractometry with the Bragg-Brantano setup.

Figure 3:
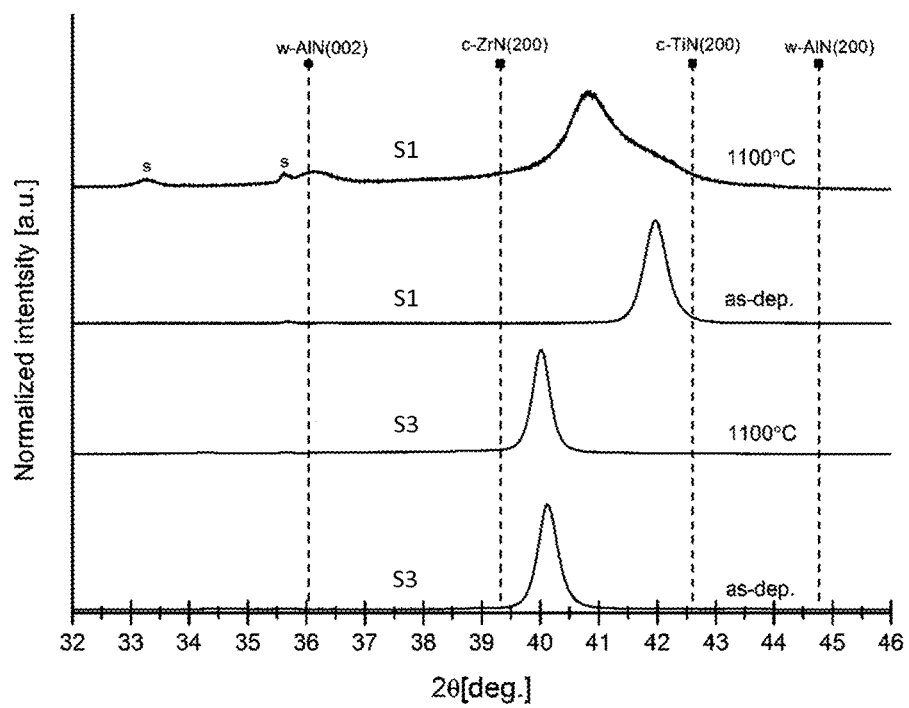
FIG. 3 is an X-ray diffractogram for as-deposited and annealed coatings of two different compositions.

FIG. 3 shows such X-ray diffractograms for as-deposited and annealed $Ti_{0.13}Zr_{0.69}Al_{0.18}N$ (S3) and $Ti_{0.30}Zr_{0.24}Al_{0.46}N$ (S1). For as-deposited samples, the (200)-peak from cubic TiZrAlN phase is identified at $2\theta=40.8°$ for S3 and $2\theta=42.08°$ for S1, while other peaks (labelled 's') originate from phases in the cemented carbide substrate. For S3 there is no apparent change in structure before and after annealing. A small peak shift of the (200) peak may be attributed to stress relaxation. The composition is thus very stable. After annealing of the S1 coating, the cubic (200) peak is asymmetric due to formation of another cubic phase with a (200) diffraction peak at lower angles. This corresponds to a phase with a lattice parameter closer to that of ZrN. The coating thus has a principally cubic microstructure. The decomposition of the composition in the coatings into less desirable phases, such as hexagonal w-AlN, is thus low or at least slow.

Although the present embodiment(s) has been described in relation to particular aspects thereof, many other variations and modifications and other uses will become apparent to those skilled in the art. It is preferred therefore, that the present embodiment(s) be limited not by the specific disclosure herein, but only by the appended claims.

What is claimed is:

1. A coated cutting tool comprising a substrate and a coating disposed on the substrate, wherein the coating includes one layer of $Ti_xZr_yAl(1-x-y)N$ where $0<x\leq0.3$, $0.4<y\leq0.8$ and $0.1\leq(1-x-y)\leq0.7$.

2. The coated cutting tool according to claim 1, wherein $x\geq0.05$.

3. The coated cutting tool according to claim 1, wherein $x\leq0.25$.

4. The coated cutting tool according to claim 1, wherein $y\leq0.6$.

5. The coated cutting tool according to claim 1, wherein the layer of $Ti_xZr_yAl(1-x-y)N$ has a cubic crystal structure.

6. The coated cutting tool according to claim 1, wherein the layer of $Ti_xZr_yAl(1-x-y)N$ has a columnar microstructure.

7. The coated cutting tool according to claim 1, wherein an X ray diffractogram of the layer of $Ti_xZr_yAl(1-x-y)N$ has a dominant peak of a (200) plane.

8. The coated cutting tool according to claim 1, wherein the layer of $Ti_xZr_yAl(1-x-y)N$ is deposited by PVD, such as arc evaporation or sputtering.

9. The coated cutting tool according to claim 1, wherein the coating includes an adhesion layer and the layer of $Ti_xZr_yAl(1-x-y)N$ is disposed on top of the adhesion layer.

10. The coated cutting tool according to claim 1, wherein the coating has an adhesion of at least 50 kg, at least 100 kg, or at least 150 kg, as evaluated from a Rockwell indentation test.

11. The coated cutting tool according to claim 1, wherein the coating has a thickness of more than 0.5 μm.

12. The coated cutting tool according to claim 1, wherein the layer of $Ti_xZr_yAl(1-x-y)N$ has a thickness of more than 5 nm.

13. The coated cutting tool according to claim 1, wherein the substrate comprises cemented carbide or polycrystalline cubic boron nitride.

14. The coated cutting tool according to claim 1, wherein $0.1\leq x\leq0.3$.

15. The coated cutting tool according to claim 1, wherein $0.2\leq x\leq0.3$.

16. The coated cutting tool according to claim 1, wherein $0.6\leq y\leq0.8$.

17. The coated cutting tool according to claim 1, wherein the layer of $Ti_xZr_yAl(1-x-y)N$ has a thickness of less than 20 μm.

18. A coated cutting tool comprising a substrate and a coating deposited on the substrate, wherein the coating comprises layers of $Ti_xZr_yAl(1-x-y)N$ where $0<x\leq0.3$, $0.2\leq y\leq0.8$ and $0.1\leq(1-x-y)\leq0.7$, and wherein the coating is a multilayer coating and the $Ti_xZr_yAl(1-x-y)N$ layers alternate with one or more layers selected from the group of TiN, TiAlN, TiSiN, TiSiCN, TiCrAlN, and CrAlN, or combinations thereof.

19. The coated cutting tool according to claim 18, wherein $0.2\leq y\leq0.4$.

20. The coated cutting tool according to claim 18, wherein $0.3\leq y\leq0.8$ or $0.4\leq y\leq0.8$.

21. The coated cutting tool according to claim 18, wherein $0.6\leq y\leq0.8$.

22. The coated cutting tool according to claim 18, wherein the coating has a thickness of less thans 20 μm.

* * * * *